United States Patent
Wohlfarth et al.

[19]

[11] Patent Number: 5,999,044
[45] Date of Patent: Dec. 7, 1999

[54] DIFFERENTIAL DRIVER HAVING MULTIPLE OUTPUT VOLTAGE RANGES

[75] Inventors: Paul D. Wohlfarth, Vernonia; Robert R. Hale, Beaverton; Bryan J. Dinteman, Canby, all of Oreg.

[73] Assignee: Credence Systems Corporation, Fremont, Calif.

[21] Appl. No.: 09/059,642

[22] Filed: Apr. 13, 1998

[51] Int. Cl.[6] .................................. H03F 3/45; H03G 3/10
[52] U.S. Cl. ............................ 327/563; 327/65; 330/254
[58] Field of Search ................... 327/563, 52, 65, 327/374; 330/254, 133, 134

[56] References Cited

U.S. PATENT DOCUMENTS

| | | | |
|---|---|---|---|
| 4,191,856 | 3/1980 | Nagano et al. | 327/411 |
| 4,464,633 | 8/1984 | Harwood et al. | 330/254 |
| 5,047,665 | 9/1991 | Burt | 330/253 |
| 5,216,384 | 6/1993 | Vanhecke | 330/133 |
| 5,668,495 | 9/1997 | Vora et al. | 327/108 |
| 5,724,361 | 3/1998 | Fiedler | 327/407 |
| 5,742,203 | 4/1998 | Van De Plassche et al. | 330/254 |

*Primary Examiner*—Timothy P. Callahan
*Assistant Examiner*—Terry L. Englund
*Attorney, Agent, or Firm*—Smith-Hill and Bedell

[57] ABSTRACT

A differential driver includes an input stage and an output stage. The input stage receives a differential INPUT signal to produce a differential DRIVE signal of state determined by the INPUT signal. The output stage receives the DRIVE signal and produces a differential OUTPUT signal of state determined by the DRIVE signal. The OUTPUT signal voltage can be adjusted within any of multiple ranges. The output stage adjusts its output load resistance for each OUTPUT signal voltage range in order to maximize operating speed while limiting power consumption in each range. The input stage automatically reduces the voltage of the DRIVE signal input to the output stage for low OUTPUT signal voltages to reduce noise in the OUTPUT signal.

16 Claims, 3 Drawing Sheets

DIFFERENTIAL DRIVER HAVING MULTIPLE OUTPUT VOLTAGE RANGES

BACKGROUND OF THE INVENTION

1. Field of the Invention

The present invention relates in general to differential drivers and in particular to a differential driver having multiple output voltage ranges.

2. Description of Related Art

FIG. 1 illustrates a well-known prior art differential driver 1 for responding to a differential input signal (INPUT) by producing a differential output signal (OUTPUT) having adjustable voltage levels. Driver 1 employs a pair of transistors QA and QB having emitters connected to a current source 2 and collectors separately coupled to the output of a digital-to-analog converter (DAC) 3 through a matching pair of resistors RA and RB. The output voltage of a DAC 4 controls the amount of current flowing through source 2. The INPUT signal is applied across the bases of transistors QA and QB. When INPUT+ swings high and INPUT− swings low, transistor QA turns on and transistor QB turns off. Transistor QA directs the current drawn by source 2 through resistor RA. The resulting voltage drop across resistor RA pulls OUTPUT+ to a low level ($V_{LOW}$). Resistor RB pulls OUTPUT− up to the output voltage $V_{HIGH-}$ of DAC 3. Conversely, when INPUT− swings high and INPUT+ swings low, transistor QA turns off allowing OUTPUT+ to rise to $V_{HIGH}$ and transistor QB turns on pulling OUTPUT− down to $V_{LOW}$. Input data $D_{HIGH}$ to DAC 3 sets the level of $V_{HIGH}$. Input data $D_{LOW}$ to DAC 4 sets the amount of current through current source 2, thereby setting the level of $V_{LOW}$.

Various factors limit the speed of operation of driver 1. Inherent capacitance at the collectors of transistors QA and QB, together with the load impedance of RA and RB cause voltage swings in the OUTPUT signal to exhibit RC exponential charging behavior rather than to change abruptly in response to a state change in the INPUT signal. The resulting lag between state changes in the INPUT and OUTPUT signals limits the speed at which driver 1 can operate. The OUTPUT signal slew rate can be increased by reducing the resistance of RA and RB and increasing the current drawn by source 2, but only at the cost of an undesirable increase in the driver's power consumption.

The well-known Miller effect can also limit the operating speed of driver 1. When driver 1 requires a substantial gain G in order to provide a desired output voltage range, the inherent collector-base capacitance $C_{cb}$ of transistors QA and QB appears to the INPUT signal to be a base-ground capacitance G+1 times as large as $C_{cb}$. This apparent input capacitance, in connection with the drive impedance behind the INPUT signal reduces the INPUT signal's slew rate and therefore limits the driver's switching speed. The Miller effect can be reduced by reducing the drive impedance and increasing the base current, but this also increases power consumption. The Miller effect can also be reduced by limiting INPUT signal swing, but only at the cost of reducing OUTPUT signal range.

At the low end of the OUTPUT signal voltage range noise in the INPUT signal coupled through the QA and QB collector-base capacitances can become an excessively large component of the OUTPUT signal. The collector-base capacitance of transistors QA and QB also causes "preshoot" in the OUTPUT signal which can also limit driver operating speed. For example, when the INPUT+ logic signal goes low, the collector of transistor QA goes low briefly before transistor QA turns off. Since the collector voltage is initially driven below $V_{LOW}$ charging current passing through RA after QA turns off takes longer to supply enough charge to the collector capacitance to bring the collector voltage up to $V_{HIGH}$. At the low end of the OUTPUT signal range, this preshoot effect becomes a significant factor in limiting slew rate.

The resolution with which driver circuit 1 can adjust the low logic level $V_{LOW}$, of its OUTPUT signal is entirely a function of the resolution of DAC 4. To increase the driver's resolution we must increase the resolution of DAC 4, but high resolution DACs are expensive.

What is needed is a high speed wide range differential driver having output signal voltages that can be adjusted with high resolution without requiring the use of a high resolution DAC.

SUMMARY OF THE INVENTION

A differential driver in accordance with the invention includes an input stage and an output stage. The input stage conditions an input differential logic signal (INPUT) to produce a differential logic drive signal (DRIVE) and the output stage responds to the state of the DRIVE signal by producing a differential output logic signal (OUTPUT) having an adjustable voltage.

In accordance with one aspect of the invention, the output stage may be set to operate in any of multiple OUTPUT signal voltage ranges, and the OUTPUT signal voltage can be adjusted to any of several voltage levels within each range. The output stage employs a separate transistor pair to switch the DRIVE signal for each voltage range, each transistor pair being provided with a load resistance appropriately sized for the voltage range to provide an appropriate trade off between operating speed and power consumption. A switch selectively connects a DAC-controlled current source to the transistor pair for the selected output voltage range. The DAC output controls the OUTPUT signal voltage with a resolution that is appropriate for the range selected.

In accordance with another aspect of the invention, the input stage automatically reduces the voltage of the DRIVE signal input to the output stage for low OUTPUT signal voltages to reduce noise in the OUTPUT signal.

It is accordingly an object of the invention to provide a multiple range differential driver having output signal voltages that can be adjusted with a resolution that is appropriate for each range.

It is another object of the invention to provide a differential driver that minimizes power consumption at multiple output signal levels.

It is a further object of the invention to provide a differential driver that maximizes operating speed at multiple output signal levels.

It is a still further object of the invention to provide a differential driver that minimizes the effect of input signal switching noise at multiple output signal levels.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
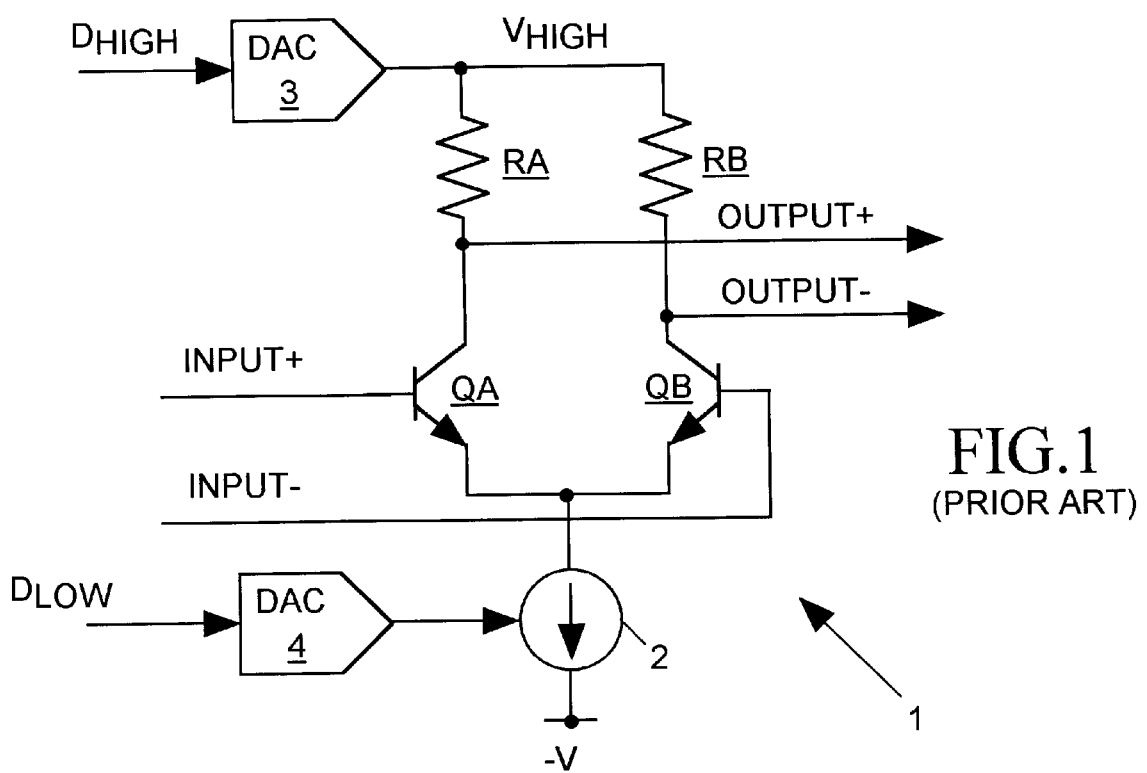
FIG. 1 illustrates in schematic diagram form a prior art differential driver.
Figure 2:
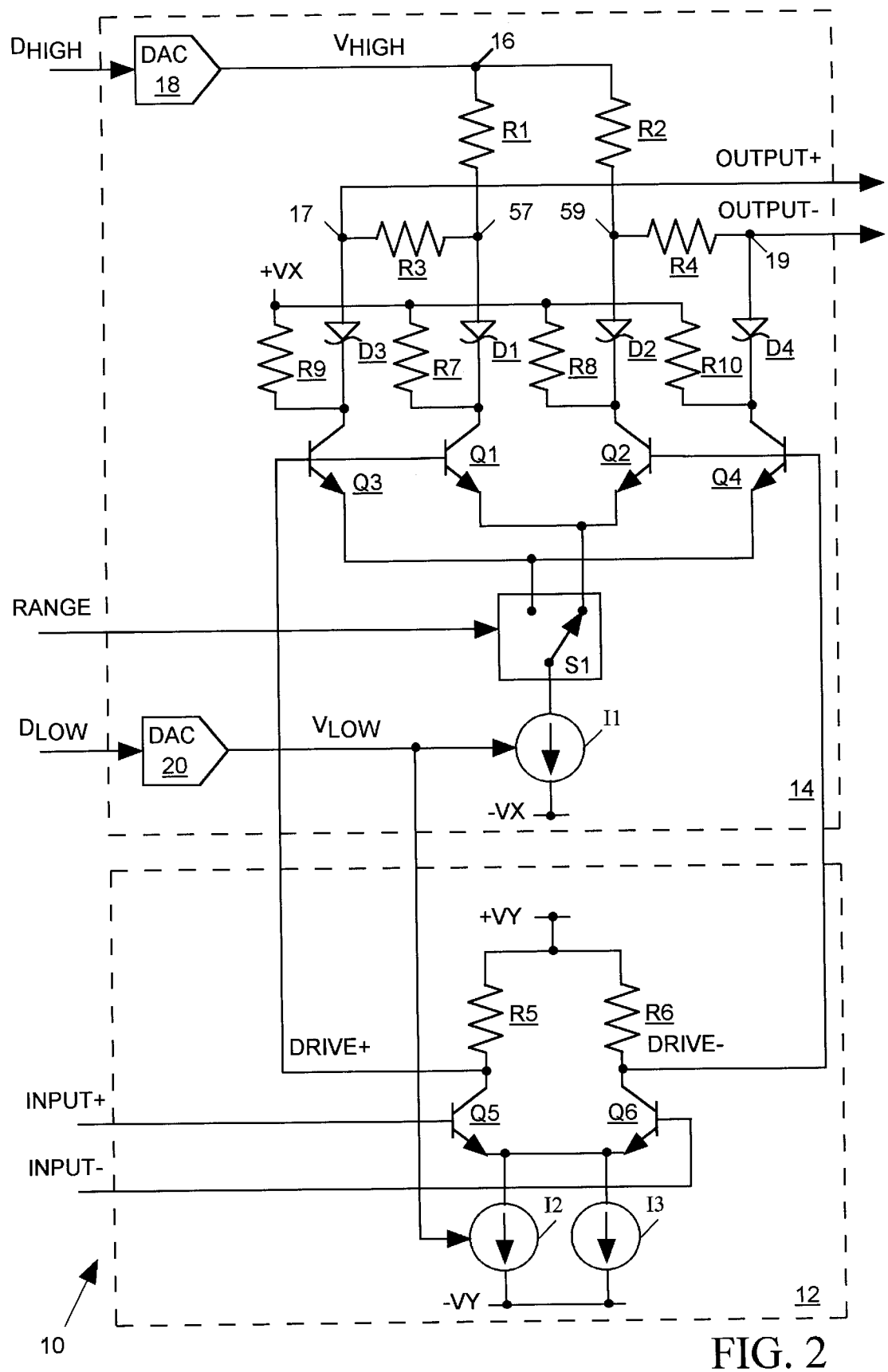
FIG. 2 illustrates in combined block and schematic diagram form a multiple range differential driver in accordance with the present invention.

FIG. 2 illustrates in combined block and schematic diagram form a multiple range differential driver 10 in accordance with the present invention. Driver 10 produces a differential output signal (OUTPUT) of state determined by a single-ended or differential input signal INPUT. The differential OUTPUT signal has OUTPUT+ and OUTPUT− signal components. When OUTPUT+ or OUTPUT− is at a high voltage level ($V_{HIGH}$), the other signal component OUTPUT− or OUTPUT+ is at a low level $V_{LOW}$. Input data $D_{HIGH}$ sets the high signal level $V_{HIGH}$ and input data $D_{LOW}$ sets $V_{LOW}$, by adjusting the OUTPUT signal's differential voltage, the difference between the high and low levels ($V_{HIGH}-V_{LOW}$). Driver 10 has two operating modes. In a "high range" mode, driver 10 provides a differential OUTPUT voltage that may be adjusted to any level within a relatively wide voltage range. In a "low range" mode driver 10 provides an OUTPUT voltage that may be adjusted to any level within a relatively narrow voltage range. An input RANGE bit selects the driver's operating mode.

Drive Circuit Topology

Driver 10 includes an input stage 12 for conditioning the INPUT signal to produce a differential signal (DRIVE) and an output stage 14 for producing the OUTPUT signal of state determined by the DRIVE signal. Input stage 12 includes a pair of resistors R5 and R6, a pair of transistors Q5 and Q6, a pair of current sources I2 and I3, and a pair of voltage sources +VY and −VY. The INPUT signal is applied across the bases (control terminals) of transistors Q5 and Q6. Resistors R5 and R6 connect the collectors (first load terminals) of transistors Q5 and Q6 to voltage source +VY. Current sources I2 and I3 couple the emitters (second control terminals) of transistors Q5 and Q6 to source −V. The DRIVE signal appears across the collectors of transistors Q5 and Q6. The collector of transistor Q5 is tied to the bases of transistors Q1 and Q3 while the collector of transistor Q6 is tied to the bases of transistors Q2 and Q4.

Output stage 14 includes four NPN transistors Q1–Q4, four Schottky diodes D1–D4, eight resistors R1–R4 and R7–R10, a current source I1, a switch S1, circuit nodes 16, 17 and 19, two digital-to-analog converters (DACs) 18 and 20, and voltage sources +VX and −VX. DAC 18 receives input data $D_{HIGH}$ and produces the high level output voltage $V_{HIGH}$ at node 16. DAC 20 receives the $D_{LOW}$ data and provides a control signal $V_{CONT}$ input to both current sources I1 and I2. The magnitude of $D_{LOW}$ controls the magnitude of $V_{CONT}$ which in turn controls the magnitude of current drawn by source I1, and therefore the gain of output stage 14. Resistor R1 and diode D1 in series link the collector of transistor Q1 to node 16 while resistor R2 and diode D2 in series link the collector of transistor Q2 to node 16. Resistors R1 and R3 are connected in series between nodes 16 and 17, and diode D3 is connected between node 17 and the collector of transistor Q3. Resistors R2 and R4 are connected between nodes 16 and 19 and diode D4 is connected between node 19 and the collector of transistor Q4. Resistors R7–R10 respectively link collectors of transistors Q1–Q4 to source +VX. Switch S1, controlled by the input RANGE data bit, connects the emitters of transistors Q1 and Q2 to current source I1 when the RANGE bit is low and connects the emitters of transistors Q3 and Q4 to current source I1 when the RANGE bit is high. The OUTPUT signal appears across circuit nodes 17 and 19, the output terminals of output stage 14.

High Range Mode Operation

The RANGE bit input to switch S1 is set high when driver 10 is to produce an OUTPUT signal swing within its high OUTPUT voltage range. With the RANGE bit selecting the high OUTPUT signal range mode, switch S1 connects emitters of transistors Q3 and Q4 to current source I1 and disconnects current source I1 from the emitters of transistors Q1 and Q2. When the differential INPUT signal goes true (+=HIGH), it turns on transistor Q5 and turns off transistor Q6. Charging current supplied from +VY through resistor R6 pulls the voltage DRIVE− at the collector of transistor Q6 and base of transistor Q4 to +VY, while load current flowing through resistor R5 causes a voltage drop across resistor R5 thereby driving down a voltage DRIVE+ at the collector of transistor Q5 and base of transistor Q3. As the voltage DRIVE+ goes low it turns off transistor Q3, and as the voltage DRIVE− at the base of transistor Q4 goes high transistor Q4 turns on. As transistor Q3 turns off, charging current from DAC 18 supplied through resistors R1 and R3 and diode D3 pulls node 17 up to the high logic level $V_{HIGH}$. With transistor Q3 off and transistor Q4 on, and with transistors Q1 and Q2 disconnected from current source I1, all of the current drawn by current source I1 passes from node 16 through resistors R2 and R4, diode D4 and transistor Q4. This current causes a voltage drop across resistors R2 and R4 pulling node 19 down to the low level ($V_{LOW}$). Assuming the OUTPUT signal is driving high impedance, OUTPUT+ will rise to $V_{HIGH}$ and OUTPUT− will fall to $V_{LOW}$.

When the differential INPUT signal goes false (+=LOW), it turns off transistor Q5 and turns on transistor Q6. Rising voltage DRIVE+ turns on transistor Q3 while falling voltage DRIVE+ turns off transistor Q4. As transistor Q4 turns off, charging current from DAC 18 supplied through resistors R2 and R4 and diode D4 pulls the collector of transistor Q4 up to $V_{HIGH}$, thereby driving OUTPUT− to $V_{HIGH}$. When transistor Q3 turns on, current drawn by current source I1 causes a voltage drop across resistors R1 and R3 and diode D3 pulling the collector of transistor Q3, and therefore the voltage of OUTPUT+, down to the low level ($V_{LOW}$).

In the high range mode, the OUTPUT signal voltage ($V_{HIGH}-V_{LOW}$) can range from a low of 0 volts (when I1 is set to 0 milliamps) to a large value when I1 is set to its maximum value. If matching resistors R1 and R2 have resistance RL and matching resistors R3 and R4 have resistance RH, then the OUTPUT signal voltage $V_{OUTPUT}$ is $$V_{OUTPUT}=I1 \times (RL+RH).$$

The maximum OUTPUT signal voltage for the high range mode is therefore a function of the maximum current that source I1 can produce and the values of RL and RH. For example if the maximum possible value of I1 is 50 milliamps, and RL is 10 Ohms and RH is 40 Ohms, then the OUTPUT signal voltage can range from 0 to 2.5 volts when driver 10 operates in its high range mode.

Low Range Mode Operation

The RANGE bit input to switch S1 is set low when driver 10 is to operate in its low OUTPUT signal range mode. With the RANGE bit low, switch S1 connects emitters of transistors Q1 and Q2 to current source I1 and disconnects emitters of transistors Q3 and Q4 from current source I1. When the differential INPUT signal goes true (+=HIGH), it turns on transistor Q5 and turns off transistor Q6, thereby pulling voltage DRIVE+ low and pulling voltage DRIVE− high. Falling voltage DRIVE+ turns off transistor Q1 while the rising voltage DRIVE− turns on transistor Q2. As transistor Q1 turns off, charging current from DAC 18 supplied through resistor R1 and diode D1 pulls node 57 up to the high logic level $V_{HIGH}$. With transistor Q2 on, the current drawn by current source I1 passes from node 16 through resistor R2, diode D2 and transistor Q2 causing a voltage drop across resistor R2 and pulling the voltage node 59 down to the low level ($V_{LOW}$) Since resistors R3 and R4 couple the collectors of Q1 and Q2 to the OUTPUT+ and OUTPUT− components of the signal, OUTPUT+ rises to $V_{HIGH}$ and OUTPUT− falls to $V_{LOW}$.

When the differential INPUT signal goes false (+=LOW), transistor Q5 turns off, transistor Q6 turns on, voltage DRIVE+ goes up and voltage DRIVE− goes down. Transistor Q1 turns on pulling OUTPUT+ down to $V_{LOW}$, and transistor Q2 turns off allowing DAC 18 to pull OUTPUT− up to $V_{HIGH}$.

In the low range mode, the differential OUTPUT signal voltage is $$V_{OUTPUT} = I1 \times RL.$$

$V_{OUTPUT}$ can therefore range from a minimum of 0 volts (when I1 is 0) to a maximum that is a function of the maximum current that source I1 can produce and the value of RL. For example if the maximum possible value of I1 is 50 milliamps, and if RL is 10 Ohms, then the OUTPUT signal voltage can range from 0 to 1 volts when driver 10 operates in its low range mode.

Speed and Power Considerations

When driver 10 operates in its high range, the upper limit of its high OUTPUT signal voltage range is achieved when the current output of source I1 is set to its maximum, $I1_{MAX}$. Since high currents mean high power consumption, it is desirable that $I1_{MAX}$ be kept small and RL+RH be large in order to achieve a high maximum OUTPUT signal voltage with minimal power consumption. However when we increase the magnitude RL+RH of the load resistors we reduce the slew rate of the OUTPUT signal, thereby decreasing the speed of operation of driver 10. When transistor Q3 (or Q4) turns off, DAC 18 has to supply a charging current to inherent circuit capacitance at the collector of transistor Q3 (or Q4) via resistors R1 and R3 (and R2 and R4) in order to pull OUTPUT+ (or OUTPUT−) up to $V_{HIGH}$. If we increase the resistance RL+RH of load resistors R1 and R3 (or R2 and R4), then we decrease the magnitude of the charging current DAC 18 supplies to charge that collector capacitance and we increase the amount of time required to pull OUTPUT+ (or OUTPUT−) up. While the total resistance RL and RH is suitably selected to match the output tranmission line characteristic impenance, the selection of the size of $I1_{MAX}$ and the related sizes of resistors RL and RH of the load resistors represents a trade off between power consumption and driver operating speed at the maximum OUTPUT signal voltage of driver 10.

Range Switching

With driver 10 operating in its high OUTPUT voltage range, we can decrease the OUTPUT signal swing from its maximum, by adjusting input data $D_{LOW}$ so as to decrease the amount of current drawn by current source I1. This reduces the voltage drop that develops across load resistors R1 and R3, or R2 and R4.

Driver 10, when operating its high range mode, can produce an OUTPUT voltage close to 0 when we set input data $D_{LOW}$ so that the output current of source I1 is very small. However when the desired OUTPUT signal voltage is within the low range of driver 10 there are benefits to switching driver 10 to its low voltage range mode. In the low range mode, the driver's load resistance is reduced from RH+RL to RL because load current is drawn only through resistor R1 or R2 instead of through resistors R1 and R3 or resistors R2 and R4. Accordingly when DAC 18 has to pull OUTPUT+ or OUTPUT− up to $V_{HIGH}$ the charging current it supplies to the capacitance at the collector of Q1 or Q3 passes through less resistance. For a given OUTPUT signal swing, the charging current in the low range mode is therefore larger than it would be if the same OUTPUT signal swing were produced in the high range mode. Since the OUTPUT signal slew rate increases with the magnitude of that charging current, the driver's switching speed is faster for a given OUTPUT signal swing when operating in its low range mode then when operating in its high range mode.

Another benefit of switching to the low range mode when producing smaller OUTPUT swing is that it increases the resolution with which the OUTPUT signal swing can be adjusted. As an example, suppose current source I1 can produce a maximum output current of 100 milliamps, that RL=10 OHMs and that RH=40 OHMs. Then the maximum possible OUTPUT signal voltage in the high range is 100 milliamps×50 Ohms=5 volts and the maximum OUTPUT signal voltage in the low range is 100 milliamps×10 Ohms=1 volt. Suppose also that DAC 20 has 8-bit resolution. Then when in its high range mode, driver 10 can provide any of 256 different output voltages between 0 and 5 volts or less. Thus in the high range, driver can provide an output voltage resolution of 5/256 volts, or about 0.02 volts. When we switch driver 10 to its low range, it can provide any of 256 different voltages between 0 and 1 volt, a resolution of 1/256 volt, or about 0.004 volts. Since in the lower range the differences between high and low logic levels are smaller, it is appropriate that OUTPUT voltage resolution be better in the lower output voltage range.

Collector Capacitance Isolation

When driver 10 operates in its low range mode transistors Q3 and Q4 do not draw any current and source +VX supplies charging current through resistors R9 and R10 to reverse bias Schottky diodes D3 and D4. Since Schottky diodes have relatively low capacitance, they isolate the relatively high collector capacitance of transistors Q3 and Q4 from the OUTPUT signal. Thus, although not required for circuit operation, diodes D3 and D4 reduce the collector capacitance seen by the charging currents when driving OUTPUT+ or OUTPUT− to $V_{HIGH}$, and therefore improve the OUTPUT signal's slew rate when the circuit operates in its low range mode. Similarly diodes D1 and D2 and resistors R7 and R8 isolate the collector capacitance of transistors Q1 anti Q2 from the OUTPUT signal when driver 10 is operating in its high range mode.

Switching Noise Control

Switching speed increases with the magnitude of the DRIVE signal input to output stage 14, but so too does noise in the OUTPUT signal. The inherent collector-base capacitance of transistors Q1–Q4 couples the DRIVE signal to the OUTPUT signal so that when the DRIVE signal changes state, noise in the form of "preshoot" and "overshoot" appears in the OUTPUT signal. The magnitude of preshoot and overshoot noise produced in the OUTPUT signal increases with the magnitude of the DRIVE signal and is independent of the magnitude of the OUTPUT signal. Preshoot and overshoot noise can be relatively large but not a significant portion of the OUTPUT signal magnitude when the OUTPUT signal magnitude is large. But at low OUT- PUT signal voltage swings, such noise can become a significant portion on the OUTPUT signal swing and could affect its apparent logic state. To limit the effects of switching noise the DRIVE signal level is reduced as OUTPUT signal levels decrease. To that end variable current source I2 is controlled by the same DAC 20 output $V_{LOW}$ that controls current source I1. When $V_{CONT}$ decreases the current drawn by current source I1, thereby to decrease the OUTPUT signal voltage magnitude, it also decreases the current drawn by current source I2. This decreases the voltage swing across resistors R5 and R6 of input stage 12, thereby decreasing the magnitude of the DRIVE signal to reduce the noise level in the OUTPUT signal. Conversely, when the $V_{LOW}$ signal increases the voltage swing of the OUTPUT signal, it also increases the voltage swing of the DRIVE signal, thereby increasing driver switching speed. Current source I3 draws a small fixed current to provide a minimum operating current for input stage 12 when the current through source I2 is very low, thereby ensuring complete switching at very low levels of $V_{LOW}$.

Adding Voltage Ranges

Driver 10 of FIG. 2 provides for two OUTPUT voltage ranges, because switch S1 can switch between two sets of emitter-coupled pairs (Q1/Q2 and Q3/Q4) selected by switch S1 and because the load resistance is segmented into two sets of two resistors (R1/R2 and R3/R4) connected to provide a separate load resistance for each emitter-coupled transistor pair. Those skilled in the art will appreciate that driver 10 could be expanded to provide more than two output signal ranges. For example a four-range driver would require four emitter-coupled transistor pairs, a switch S1 capable of selecting from among those four in response to 2-bit RANGE data, and load resistance segmented into two sets of four resistors so as to provide a separate load resistance for each of the four emitter-coupled pairs.

Cascode Stage

Figure 3:
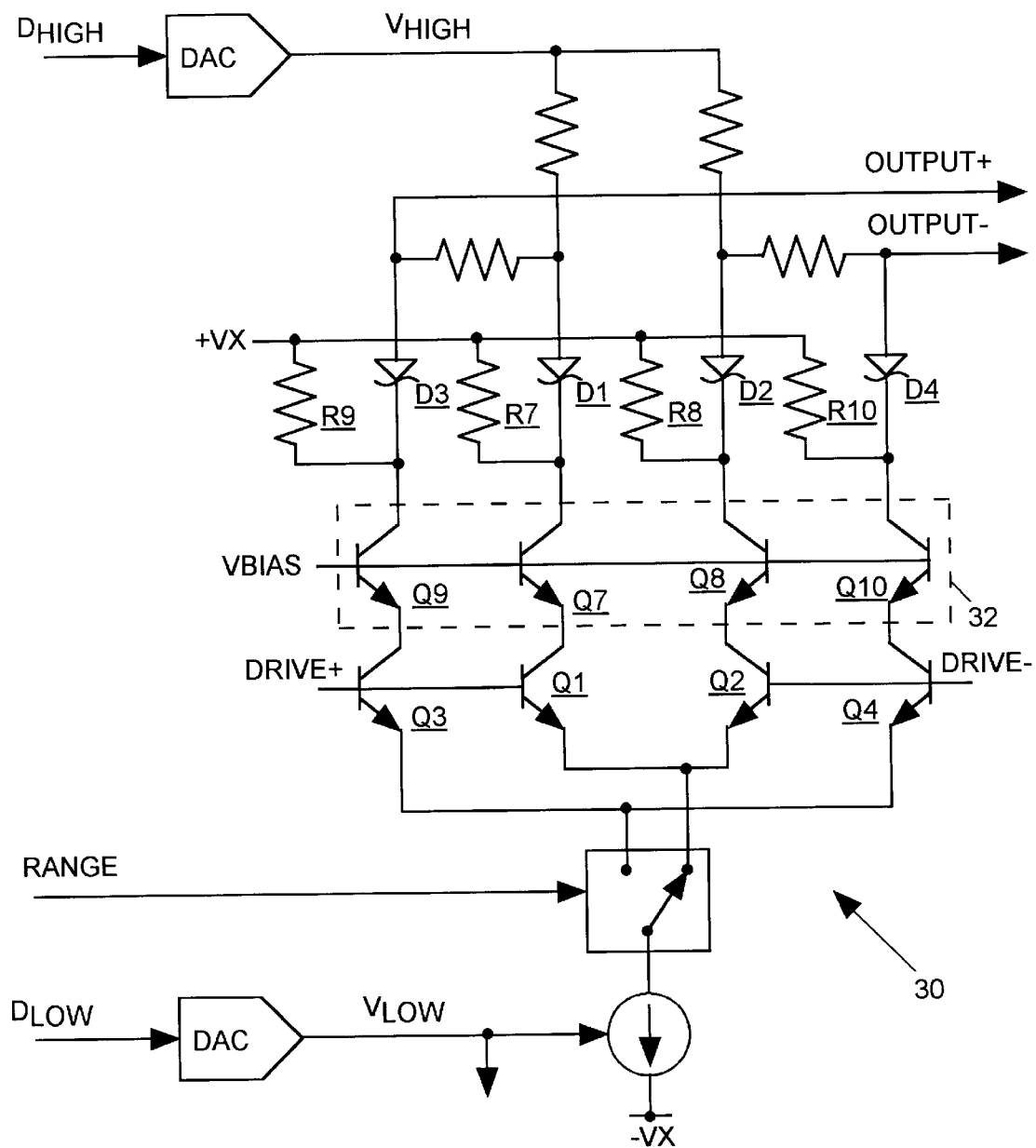
FIG. 3 illustrates in combined block and schematic diagram an improved version of the output stage of the driver of FIG. 2 in accordance with the present invention.

FIG. 3 is a combined block and schematic diagram illustrating an alternative version 30 of output stage 14 of FIG. 2 in which a cascode stage 32 has been added. Cascode stage 32 includes a set of transistors Q7–Q10 respectively inserted between diodes D1–D4 and collectors of transistors Q1–Q4. A constant voltage VBIAS drives the bases of transistors Q7–Q10. Cascode stage 32, which maintains the collector voltage of each transistor Q1–Q4 at a constant level slightly below VBIAS, isolates the collectors of transistors Q1–Q4 from the OUTPUT signal and helps to further reduce Miller effect, the preshoot effect, and coupling of INPUT signal noise to the OUTPUT signal.

Thus has been shown and described a differential driver having adjustable load resistances and currents permitting high speed operation in any of multiple output signal voltage ranges and which automatically reduces its drive signal level at low output signal swings to reduce noise in the output signal. While the forgoing specification has described preferred embodiment(s) of the present invention, one skilled in the art may make many modifications to the preferred embodiment without departing from the invention in its broader aspects. For example, while the differential driver of the present invention has been illustrated herein as being implemented by bipolar transistors, those skilled in the art will appreciate the driver can also be constructed using other types of transistors including, for example, MOSFET transistors having source, drain and gate terminals as first and second load and gate terminals. The appended claims therefore are intended to cover all such modifications as fall within the true scope and spirit of the invention.

eb;normal

What is claimed is:

1. A differential driver for producing a differential OUTPUT signal of state determined by a differential DRIVE signal, wherein the differential OUTPUT signal has a voltage set in response to input control data (RANGE, $D_{LOW}$ and $D_{HIGH}$), the differential driver comprising:

a first circuit node (16);

a first voltage source (18) for producing a first voltage at said first circuit node;

a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;

means (R1–R4, D1–D4) for providing first conductive paths between said first circuit node and the first load terminal of each of the first and second transistors of each of said transistor pairs;

a current source (I1) for conducting a current; and switch means (S1) controlled by said input control data for providing second conductive paths between said current source and second load terminals of the transistors of any one of said transistor pairs selected by said input control data;

wherein said first conductive paths provided between said first circuit node and the first load terminals of corresponding first and second transistors within each transistor pair have similar resistance, but wherein said first conductive paths provided between said first circuit node and said first load terminals of said first transistors within all of said transistor pairs have substantially dissimilar resistances.

2. The differential driver in accordance with claim 1 further comprising means (20) for adjusting a magnitude of said current conducted by said current source in response to said input control data.

3. (Amended) The differential driver in accordance with claim 1 wherein said first voltage source adjusts a magnitude of said first voltage in accordance with said input control data.

4. The differential driver in accordance with claim 4 further comprising means (20) for adjusting a magnitude of said current conducted by said current source in response to said input control data.

5. The differential driver in accordance with claim 1 wherein said means for providing first conductive paths between said first circuit node and each said transistor of each of said transistor pairs comprises:

first and second output terminals (17, 19) at which said OUTPUT signal is produced;

a plurality of first resistors (R1, R3) connected in series between said first circuit node and said first output terminal;

a plurality of second resistors (R2, R4), connected in series between said first circuit node and said second output terminal; and means (D1–D4) for conductively linking said first resistors to said first load terminal of each said first transistor of said transistor pairs and for conductively linking said second resistors to said first load terminal of each said second transistor of said transistor pairs.

6. A differential driver for producing a differential OUTPUT signal of state determined by a differential DRIVE signal, wherein the differential OUTPUT signal has a voltage set in response to input control data (RANGE, $D_{LOW}$ and $D_{HIGH}$), the differential driver comprising:

a first circuit node (16);

a first voltage source (18) for producing a first voltage at said first circuit node;

a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;

means (R1–R4, D1–D4) for providing first conductive paths between said first circuit node and the first load terminal of each of the first and second transistors of each of said transistor pairs;

a current source (I1) for conducting a current; and switch means (S1) controlled by said input control data for providing second conductive paths between said current source and second load terminals of the transistors of any one of said transistor pairs selected by said input control data;

wherein said means for providing first conductive paths between said first circuit node and each said transistor of each of said transistor pairs comprises:

first and second output terminals (17, 19) at which said OUTPUT signal is produced;

a plurality of first resistors (R1, R3) connected in series between said first circuit node and said first output terminal;

a plurality of second resistors (R2, R4), connected in series between said first circuit node and said second output terminal; and means (D1–D4) for conductively linking said first resistors to said first load terminal of each said first transistor of said transistor pairs and for conductively linking said second resistors to said first load terminal of each said second transistor of said transistor pairs, and wherein said means for conductively linking comprises a diode (D1) connected between one of said first resistors and the first load terminal of the first transistor of said selected one of said transistor pairs.

7. The differential driver in accordance with claim 6 further comprising:

a second voltage source (+VX) for producing a second voltage; and a third resistor (R7) connected between said second voltage source and said diode such that when said switch means connects said current source to the second load terminals of said transistor pair corresponding to said one of said first resistors, said diode is forward biased, said second voltage being of a magnitude such that when said switch means connects said current source other than to the second load terminals of the transistor pair corresponding to said one of said first resistors, said diode is reverse biased.

8. The differential driver in accordance with claim 5 wherein said first voltage source adjusts a magnitude of said first voltage in accordance with said input control data.

9. The differential driver in accordance with claim 8 further comprising means (20) for adjusting a magnitude of said current conducted by said current source in response to said input control data.

10. A differential driver for producing a differential OUTPUT signal of state determined by a differential DRIVE signal, wherein the differential OUTPUT signal has a voltage set in response to input control data (RANGE, $D_{LOW}$ and $D_{HIGH}$), the differential driver comprising:

a first circuit node (16);

a first voltage source (18) for producing a first voltage at said first circuit node;

a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;

means (R1–R4, D1–D4) for providing first conductive paths between said first circuit node and the first load terminal of the first and second transistors of each of said transistor pairs;

a current source (I1) for conducting a current; and switch means (S1) controlled by said input control data for providing second conductive paths between said current source and second load terminals of the transistors of any one of said transistor pairs selected by said input control data;

wherein said means for providing first conductive paths between said first circuit node and each said transistor of each of said transistor pairs comprises:

first and second output terminals (17, 19) at which said OUTPUT signal is produced;

a plurality of first resistors (R1, R3) connected in series between said first circuit node and said first output terminal;

a plurality of second resistors (R2, R4), connected in series between said first circuit node and said second output terminal; and means (D1–D4) for conductively linking said first resistors to said first load terminal of each said first transistor of said transistor pairs and for conductively linking said second resistors to said first load terminal of each said second transistor of said transistor pairs, and wherein said means for conductively linking said first resistors to the first load terminal of each said first transistor of its corresponding transistor pair and for conductively linking each of said second resistors to the first load terminal of each said second transistor of its corresponding transistor pair comprises cascode means (32) for maintaining the first load terminal of each of said first and second transistors at a constant voltage.

11. A differential driver for producing a differential OUTPUT signal of state determined by a differential DRIVE signal, wherein the differential OUTPUT signal has a voltage controlled in response to input control data ($D_{HIGH}$, $D_{LOW}$ and RANGE), the differential driver comprising:

an input stage (12) for receiving an INPUT signal to produce the differential DRIVE signal of state determined by the INPUT signal, wherein the DRIVE signal has a voltage controlled by a magnitude of a control signal, an output stage (14) for receiving the DRIVE signal and producing the OUTPUT signal of state determined by the DRIVE signal, wherein the OUTPUT signal has the voltage controlled by said magnitude of said control signal, and control means (20) for receiving said input control data and for generating said control signal, said control means adjusting the magnitude of said control signal in response to a change in value of said input control data, wherein said output stage comprises:
a first circuit node (16);
a first voltage source (18) for producing a first voltage at said first circuit node;
a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;
means (R1–R4) for providing separate first conductive paths between said first circuit node and the first load terminal of each of the first and second transistors of each of said transistor pairs;
a current source (I1) for receiving said control signal and for conducting a current of magnitude controlled by the magnitude of said control signal; and
switch means (S1) controlled by said input control data for providing second conductive paths between said current source and second load terminals of the transistors of any one of said transistor pairs selected by said input control data, and
wherein said first conductive paths provided between said first circuit node and the first load terminals of corresponding first and second transistors within each transistor pair have similar resistance, but wherein said first conductive paths provided between said first circuit node and the first load terminals of said first transistors of all of said transistor pairs have substantially dissimilar resistances.

12. A differential driver for producing a differential OUTPUT signal of state determined by a differential DRIVE signal, wherein the differential OUTPUT signal has a voltage controlled in response to input control data ($D_{HIGH}$, $D_{LOW}$ and RANGE), the differential driver comprising:
an input stage (12) for receiving an INPUT signal to produce the differential DRIVE signal of state determined by the INPUT signal, wherein the DRIVE signal has a voltage controlled by a magnitude of a control signal,
an output stage (14) for receiving the DRIVE signal and producing the OUTPUT signal of state determined by the DRIVE signal, wherein the OUTPUT signal has the voltage controlled by said magnitude of said control signal, and
control means (20) for receiving said input control data and for generating said control signal, said control means adjusting the magnitude of said control signal in response to a change in value of said input control data,
wherein said output stage comprises:
a first circuit node (16);
a first voltage source (18) for producing a first voltage at said first circuit node;
a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;
means (R1–R4, D1–D4) for providing first conductive paths between said first circuit node and the first load terminal of each of the first and second transistors of each of said transistor pairs;
a current source (I1) for receiving said control signal and for conducting a current of magnitude controlled by the magnitude of said control signal; and
switch means (S1) controlled by said input control data for providing second conductive paths between said current source and second load terminals of the transistors of any one of said transistor pairs selected by said input control data,
wherein the first conductive paths provided between said first circuit node and the first load terminals of corresponding first and second transistors within each transistor pair have similar resistances, but wherein the first conductive paths provided between said first circuit node end first load terminals of said first transistors of all of said transistor pairs have substantially dissimilar resistances.

13. The differential driver in accordance with claim 12 wherein said first voltage source adjusts a magnitude of said first voltage in accordance with said input control data.

14. The differential driver in accordance with claim 12 wherein said means for providing first conductive paths between said first circuit node and each said transistor of each of said transistor pairs comprises:
first and second output terminals (17, 19) at which said OUTPUT signal is produced;
a plurality of first resistors (R1, R3) connected in series between said first circuit node and said first output terminal;
a plurality of second resistors (R2, R4) connected in series between said first circuit node and said second output terminal; and means (D1–D4) for conductively linking said first resistors to said first load terminal of each said first transistor of said transistor pairs and for conductively linking said second resistors to said first load terminal of each said second transistor of said transistor pairs.

15. A differential driver for producing a differential OUTPUT signal of state determined by a differential DRIVE signal, wherein the differential OUTPUT signal has a voltage controlled in response to input control data ($D_{HIGH}$, $D_{LOW}$ and RANGE), the differential driver comprising:
an input stage (12) for receiving an INPUT signal to produce the differential DRIVE signal of state determined by the INPUT signal, wherein the DRIVE signal has a voltage controlled by a magnitude of a control signal,
an output stage (14) for receiving the DRIVE signal and producing the OUTPUT signal of state determined by the DRIVE signal, wherein the OUTPUT signal has the voltage controlled by said magnitude of said control signal, and
control means (20) for receiving said input control data and for generating said control signal, said control means adjusting the magnitude of said control signal in response to a change in value of said input control data,
wherein said output stage comprises:
a first circuit node (16);
a first voltage source (18) for producing a first voltage at said first circuit node;
a plurality of transistor pairs (Q1/Q2; Q3/Q4), each comprising a first transistor and a second transistor, each first transistor and each second transistor having a control terminal and first and second load terminals, said differential DRIVE signal driving the control terminals of the first and second transistors of each of said transistor pairs;

means (R1–R4, D1–D4) for providing first conductive paths between said first circuit node and the first load terminal of each of the first and second transistors of each of said transistor pairs;

a current source (I1) for receiving said control signal and for conducting a current of magnitude controlled by the magnitude of said control signal; and switch means (S1) controlled by said input control data for providing second conductive paths between said current source and second load terminals of the transistors of any one of said transistor pairs selected by said input control data, wherein said means for providing said first conductive paths between said first circuit node and each said transistor of each of said transistor pairs comprises:

first and second output terminals (17, 19) at which said OUTPUT signal is produced;

a plurality of first resistors (R1, R3) connected in series between said first circuit node and said first output terminal;

a plurality of second resistors (R2, R4) connected in series between said first circuit node and said second output terminal; and means (D1–D4) for conductively linking said first resistors to said first load terminal of each said first transistor of said transistor pairs and for conductively linking said second resistors to said first load terminal of each said second transistor of said transistor pairs, wherein said means for conductively linking comprises a diode (D1) connected between one of said first resistors and the first load terminal of the first transistor of said selected one of said transistor pairs.

16. The differential driver in accordance with claim 15 further comprising:

a second voltage source (+VX) for producing a second voltage; and a third resistor connected between said second voltage source and said diode such that when said switch means connects said current source to the transistor pair corresponding to said one of said first resistors, said diode is forward biased, said second voltage being of a magnitude such that when said switch means connects said current source other than to the second load terminals of the transistor pair corresponding to said one of said first resistors, said diode is reverse biased.

* * * * *